(12) United States Patent
Hirano et al.

(10) Patent No.: US 10,675,715 B2
(45) Date of Patent: Jun. 9, 2020

(54) SEMICONDUCTOR ELEMENT MANUFACTURING METHOD AND MANUFACTURING DEVICE

(71) Applicant: MITSUBISHI ELECTRIC CORPORATION, Chiyoda-ku, Tokyo (JP)

(72) Inventors: Kenji Hirano, Tokyo (JP); Katsumi Ono, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/570,570

(22) PCT Filed: Jun. 20, 2016

(86) PCT No.: PCT/JP2016/068201
§ 371 (c)(1),
(2) Date: Oct. 30, 2017

(87) PCT Pub. No.: WO2016/208522
PCT Pub. Date: Dec. 29, 2016

(65) Prior Publication Data
US 2018/0126493 A1      May 10, 2018

(30) Foreign Application Priority Data
Jun. 23, 2015   (JP) .................. 2015-125433

(51) Int. Cl.
*H01L 21/02* (2006.01)
*B23K 26/38* (2014.01)
(Continued)

(52) U.S. Cl.
CPC .......... *B23K 26/38* (2013.01); *B23K 26/0643* (2013.01); *B23K 26/0648* (2013.01);
(Continued)

(58) Field of Classification Search
CPC combination set(s) only.
See application file for complete search history.

(56) References Cited

U.S. PATENT DOCUMENTS

2002/0006765 A1   1/2002   Michel et al.
2002/0115235 A1   8/2002   Sawada
(Continued)

FOREIGN PATENT DOCUMENTS

JP   2002-324768 A   11/2002
JP   2004-268309 A    9/2004
(Continued)

OTHER PUBLICATIONS

International Search Report (PCT/Isa/210) mailed on Sep. 6, 2016, by the Japan Patent Office as the International Searching Authority for International Application No. PCT/JP2016/068201.
(Continued)

*Primary Examiner* — Moin M Rahman
(74) *Attorney, Agent, or Firm* — Buchanan Ingersoll & Rooney PC

(57) ABSTRACT

A semiconductor element manufacturing method according to the invention is such that a focal spot form of a laser light is an ellipse, and irradiation with the laser light is concentrated on a projected division line of an interface between a semiconductor substrate and a fixing sheet, which is a vaporizing pressure confining sheet, and vaporizing pressure generated by the irradiation is confined between the semiconductor substrate and the fixing sheet, and caused to act as a bending force on the semiconductor substrate, and an initial crack is extended. Because of this, energy of the laser light can be reduced, heat damage to an element region of the semiconductor substrate and debris can be reduced, and a division face with good flatness can be stably obtained.

14 Claims, 9 Drawing Sheets

(51) Int. Cl.
    *B23K 26/073* (2006.01)
    *B23K 26/359* (2014.01)
    *H01L 21/683* (2006.01)
    *B23K 26/06* (2014.01)
    *H01L 21/268* (2006.01)
    *H01L 21/78* (2006.01)
    *B23K 101/40* (2006.01)

(52) U.S. Cl.
    CPC ........ *B23K 26/0736* (2013.01); *B23K 26/359* (2015.10); *H01L 21/268* (2013.01); *H01L 21/6835* (2013.01); *H01L 21/6836* (2013.01); *H01L 21/78* (2013.01); *B23K 2101/40* (2018.08); *H01L 2221/68327* (2013.01)

(56) References Cited

U.S. PATENT DOCUMENTS

| | | |
|---|---|---|
| 2004/0002199 A1 | 1/2004 | Fukuyo et al. |
| 2005/0173387 A1 | 8/2005 | Fukuyo et al. |
| 2005/0181581 A1 | 8/2005 | Fukuyo et al. |
| 2005/0184037 A1 | 8/2005 | Fukuyo et al. |
| 2005/0189330 A1 | 9/2005 | Fukuyo et al. |
| 2005/0194364 A1 | 9/2005 | Fukuyo et al. |
| 2006/0035411 A1 | 2/2006 | Oba et al. |
| 2006/0040473 A1 | 2/2006 | Fukuyo et al. |
| 2006/0109757 A1* | 5/2006 | Nishiwaki ......... B23K 26/0057 369/44.14 |
| 2006/0160331 A1 | 7/2006 | Fukuyo et al. |
| 2008/0230725 A1* | 9/2008 | Taniguchi ............ B23K 26/066 250/492.22 |
| 2010/0055876 A1 | 3/2010 | Fukuyo et al. |
| 2010/0176100 A1 | 7/2010 | Fukuyo et al. |
| 2011/0021004 A1 | 1/2011 | Fukuyo et al. |
| 2011/0027971 A1 | 2/2011 | Fukuyo et al. |
| 2011/0027972 A1 | 2/2011 | Fukuyo et al. |
| 2011/0037149 A1 | 2/2011 | Fukuyo et al. |
| 2011/0195535 A1 | 8/2011 | Koyanagi et al. |
| 2011/0305038 A1* | 12/2011 | Kokusho ............ G02B 6/0018 362/611 |
| 2012/0190175 A1 | 7/2012 | Fukuyo et al. |
| 2012/0205357 A1 | 8/2012 | Fukuyo et al. |
| 2012/0228276 A1 | 9/2012 | Fukuyo et al. |
| 2012/0279947 A1 | 11/2012 | Fukuyo et al. |
| 2013/0017670 A1 | 1/2013 | Fukuyo et al. |
| 2015/0111365 A1 | 4/2015 | Fukuyo et al. |

FOREIGN PATENT DOCUMENTS

| | | |
|---|---|---|
| JP | 2006-051517 A | 2/2006 |
| JP | 2006-165593 A | 6/2006 |
| JP | 2009-018344 A | 1/2009 |
| JP | 2011-000605 A | 1/2011 |
| JP | 2011-165768 A | 8/2011 |
| JP | 2013-136077 A | 7/2013 |
| JP | 2015-153965 A | 8/2015 |
| WO | WO 2001/085387 A1 | 11/2001 |

OTHER PUBLICATIONS

Written Opinion (PCT/Isa/237) mailed on Sep. 6, 2016, by the Japan Patent Office as the International Searching Authority for International Application No. PCT/JP2016/068201.

\* cited by examiner

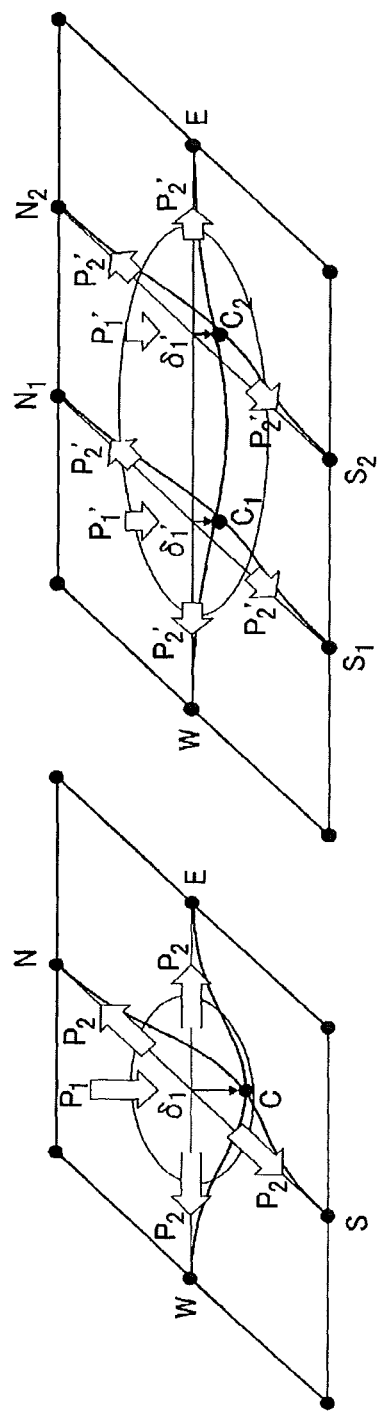

FIG. 6A

SEMICONDUCTOR ELEMENT MANUFACTURING METHOD AND MANUFACTURING DEVICE

TECHNICAL FIELD

The present invention relates to a semiconductor element manufacturing method and manufacturing device, and in particular, relates to a method and device such that a semiconductor substrate is divided into individual semiconductor elements.

BACKGROUND ART

To date, a method such that a groove that forms an origin is formed by scribing, and a three-point bending is carried out so that stress is applied in a direction in which the groove is to be spread, has been implemented as a method of dividing a semiconductor substrate into individual semiconductor elements. With this kind of mechanical processing method, however, there is a problem in that when a division interval is short, the stress of the three-point bending does not act effectively, and a large number of division failures occur. Because of this, there are expectations for a division method using laser irradiation as a division method to take the place of the mechanical processing method.

As an existing example of a division method using laser irradiation, a method such that a projected division line of a semiconductor substrate is irradiated with an ultra-short pulse laser light, thereby causing the material of the substrate to vaporize, is disclosed in Patent Document 1. Also, a method such that, by an interior of a semiconductor substrate being irradiated with a laser light and a focal point being moved along a projected division line of the semiconductor substrate, a crack region (or melting process region) is formed in the substrate interior, after which the substrate is divided by an external force being applied to the substrate, is disclosed in Patent Document 2.

CITATION LIST

Patent Literature

Patent Document 1: JP-A-2002-324768
Patent Document 2: JP-A-2006-165593

SUMMARY OF INVENTION

Technical Problem

When dividing a semiconductor substrate into individual semiconductor elements using laser irradiation, there is a requirement to obtain a division face with good flatness in an element region, while restricting deterioration of element characteristics due to heat damage to the element region and contamination caused by redeposition of vaporized material (this is known as debris). In particular, it is necessary that a division face has good flatness when forming a resonator mirror of a laser diode.

However, the division method according to Patent Document 1 is such that the semiconductor substrate material along the projected division line of the semiconductor substrate is caused to vaporize by irradiating with an ultra-short pulse laser light, because of which there is a problem in that element characteristics deteriorate due to heat damage to the semiconductor substrate element region and debris. Also, the division method according to Patent Document 2 is such that a crack extends independently from each of a large number of crack regions formed in the substrate interior, because of which there is a problem in that flatness of a division face is poor.

The invention, having been contrived in order to resolve the heretofore described kinds of problem, has an object of providing a semiconductor element manufacturing method and manufacturing device such that heat damage to a semiconductor substrate element region and debris can be reduced, and a division face with good flatness can be obtained.

Solution to Problem

A semiconductor element manufacturing method according to the invention includes a first step of affixing a vaporizing pressure confining sheet to a semiconductor substrate on which a multiple of elements are formed and forming an initial crack in one portion of a projected division line among the elements, and a second step of extending the initial crack by irradiating the projected division line of the semiconductor substrate with a laser light, thereby dividing the semiconductor substrate into the individual elements, wherein in the second step, a focal spot form of the laser light is an ellipse, a major axis of the ellipse is in a direction following the projected division line, irradiation with the laser light is concentrated on the projected division line of an interface between the semiconductor substrate and the vaporizing pressure confining sheet, and vaporizing pressure generated by the irradiation is confined between the vaporizing pressure confining sheet and semiconductor substrate, and caused to act as a bending force on the semiconductor substrate.

Also, a semiconductor element manufacturing device according to the invention includes a beam shaping device that shapes a focal spot form of a laser light emitted from a light source into an ellipse, and sets a major axis of the ellipse to a direction following a projected division line of a semiconductor substrate, beam irradiation device that concentrates irradiation with the laser light emitted from the light source on the projected division line of an interface between a vaporizing pressure confining sheet affixed to the semiconductor substrate and the semiconductor substrate, and irradiates from a side of the vaporizing pressure confining sheet, and a support member that supports the vaporizing pressure confining sheet or a reinforcement member affixed to the vaporizing pressure confining sheet on a moving stage, wherein the semiconductor substrate is disposed on the moving stage across the support member.

Advantageous Effects of Invention

According to the semiconductor element manufacturing method according to the invention, a focal spot form of a laser light is an ellipse, and an initial crack is extended by irradiation with the laser light being concentrated on a projected division line of an interface between a semiconductor substrate and a vaporizing pressure confining sheet, and vaporizing pressure generated by the irradiation being confined between the semiconductor substrate and the vaporizing pressure confining sheet, and caused to act as a bending force on the semiconductor substrate, because of which an effect of extending the crack in a major axis direction of the ellipse is greater than when the focal spot form is a perfect circle, and energy of the laser light can be reduced. Because of this, heat damage to an element region of the semiconductor substrate and debris can be reduced, and a division face with good flatness can be obtained.

Also, according to the semiconductor element manufacturing device according to the invention, a focal spot form of a laser light is shaped into an ellipse by beam shaping device, and an initial crack is extended by the laser light being concentrated on a projected division line of an interface between a semiconductor substrate and a vaporizing pressure confining sheet, irradiation being carried out from a side of the vaporizing pressure confining sheet, and vaporizing pressure generated by the irradiation being confined between the semiconductor substrate and the vaporizing pressure confining sheet, and caused to act as a bending force on the semiconductor substrate, because of which an effect of extending the crack in a major axis direction of the ellipse is greater than when the focal spot form is a perfect circle, and energy of the laser light can be reduced. Because of this, heat damage to an element region of the semiconductor substrate and debris can be reduced, and a division face with good flatness can be obtained.

Objects, characteristics, aspects, and advantages of the invention other than those heretofore described will be further clarified by the following detailed description of the invention, which references the drawings.

BRIEF DESCRIPTION OF DRAWINGS

FIG. 5A and FIG. 5B are schematic views that illustrate an effect of an increase in tensile stress caused by an elliptical focal spot in the first embodiment of the invention.

FIG. 6A to FIG. 6F are diagrams showing microscopic images of processing traces caused by laser light when an ellipse ratio of a focal spot is changed in the first embodiment of the invention.

DESCRIPTION OF EMBODIMENTS

First Embodiment

Figure 3:
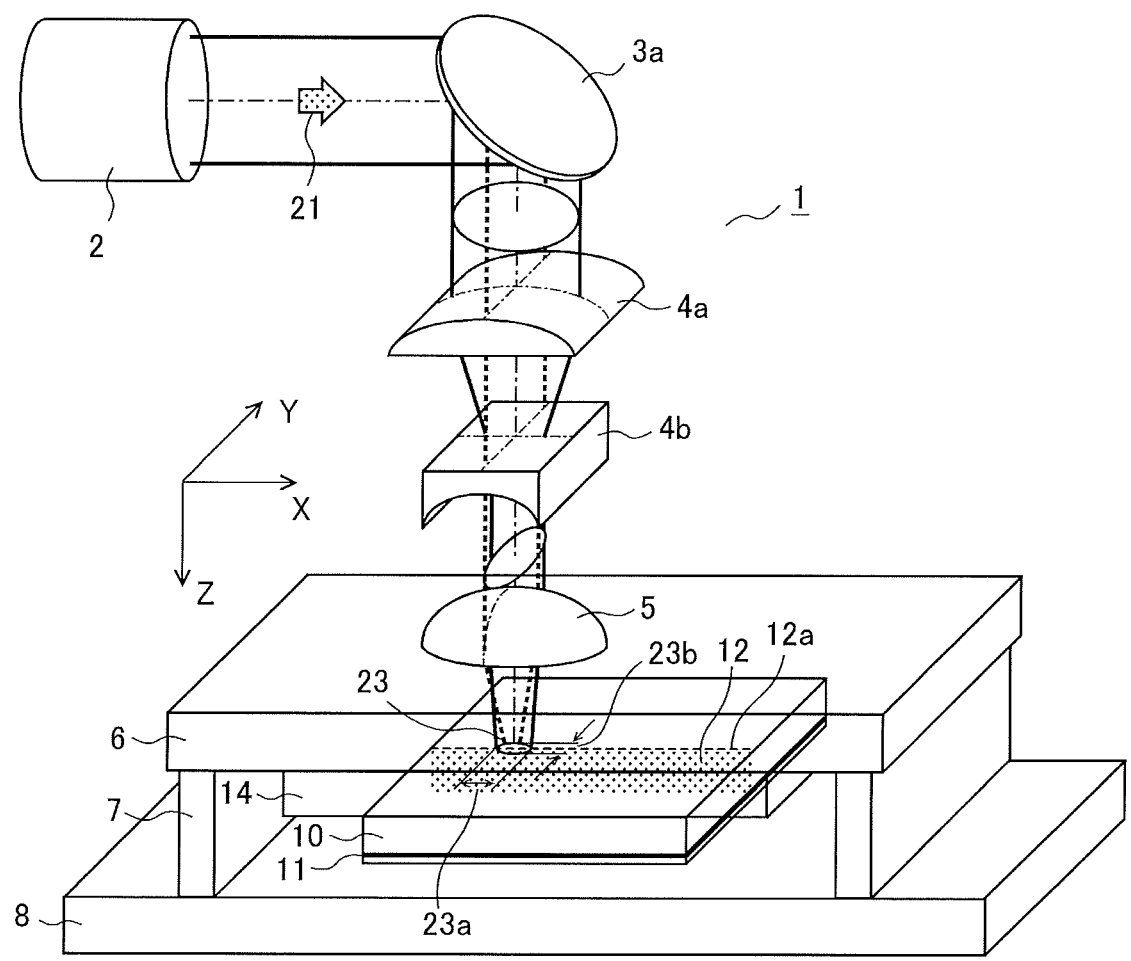
FIG. 3 is a perspective view showing a semiconductor element manufacturing device according to the first embodiment of the invention.
Figure 4A:
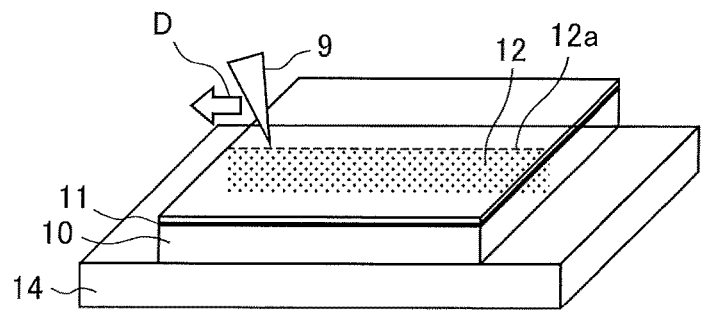
FIG. 4A to FIG. 4C are perspective views illustrating the semiconductor element manufacturing method according to the first embodiment of the invention.
Figure 4B:
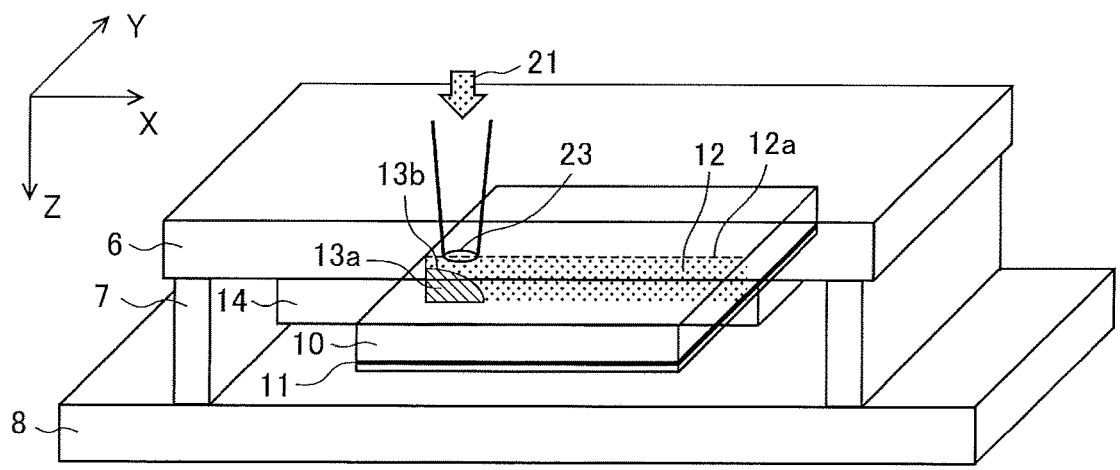
Figure 4C:
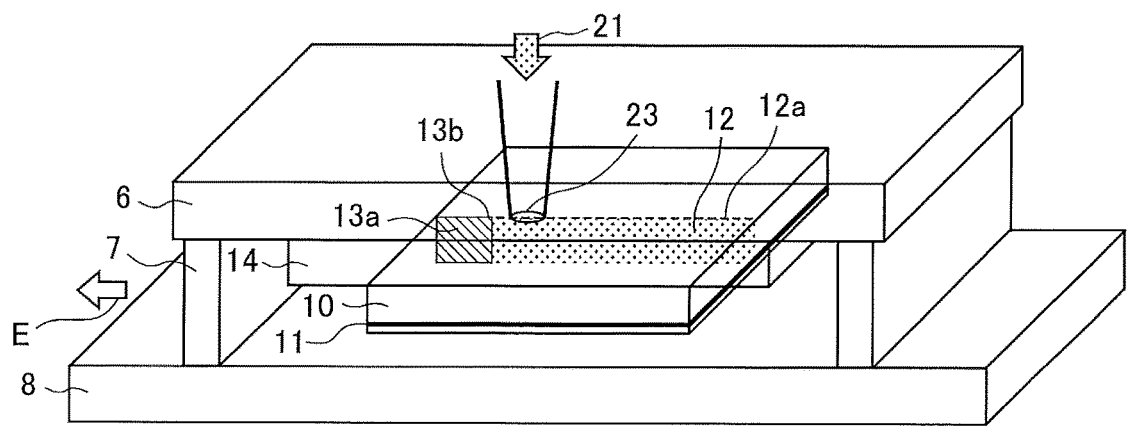

Hereafter, based on the drawings, a description will be given of a semiconductor element manufacturing method and manufacturing device according to a first embodiment of the invention. FIG. 1A to FIG. 1C and FIG. 2A to FIG. 2c are diagrams illustrating a principle of a process of extending an initial crack using the semiconductor element manufacturing method according to the first embodiment. Also, FIG. 3 shows the semiconductor element manufacturing device according to the first embodiment, and FIG. 4A to FIG. 4C show the semiconductor element manufacturing method according to the first embodiment. The same reference signs are allotted to identical or corresponding portions in the drawings.

The semiconductor element manufacturing method according to the first embodiment is a division method used in a semiconductor element division process, and includes a first step and a second step. The first step is a step of affixing a fixing sheet 14, which is a vaporizing pressure confining sheet, to a semiconductor substrate 10 having an element region 11 in which a multiple of elements 11a are formed, and forming an initial crack 13a in one portion of an inter-element projected division line 12a.

Also, the second step is a step of extending the initial crack 13a by irradiating the projected division line 12a of the semiconductor substrate 10 with a laser light 21, thereby dividing the semiconductor substrate 10 into individual elements. In the second step, the initial crack 13a is extended by irradiation with the laser light 21 being concentrated on the projected division line 12a of an interface 15 between the semiconductor substrate 10 and fixing sheet 14, causing a vaporizing pressure to be generated in the interface 15.

A description will be given, using FIG. 1A to FIG. 1C and FIG. 2A to FIG. 2C, of a principle of the process of causing a vaporizing pressure to be generated in the interface 15 using irradiation with laser light, thereby extending the initial crack 13a. In the following description, "crack 13" or "initial crack 13a" is defined as a face of a portion divided by interatomic bonds of the semiconductor substrate 10 being broken. When there is no fear of confusion, a line of intersection between a face of a divided portion and a surface of the semiconductor substrate 10 is referred to as the crack 13, and when there is fear of confusion, the line of intersection is referred to as a "crack face" or "crack line". Also, a "leading end 13b of the crack 13" is defined as a boundary line (or boundary point) between a crack face or crack line and an undivided portion.

Figure 1A:
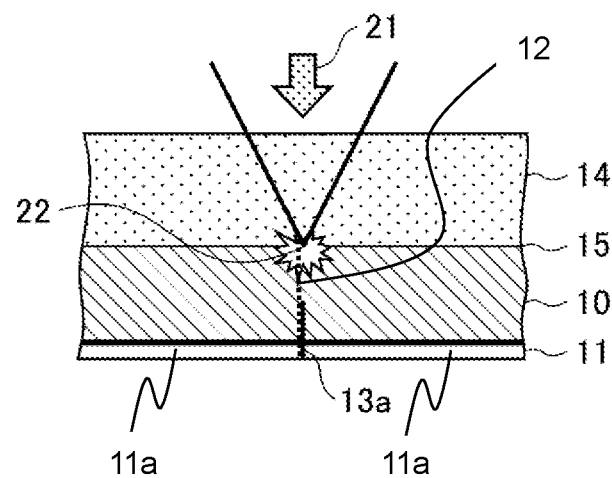
FIG. 1A to FIG. 1C are diagrams illustrating a principle of a process of extending an initial crack using a semiconductor element manufacturing method according to a first embodiment of the invention.

Firstly, using FIG. 1A to FIG. 1C, a basic processing principle will be described. As shown in FIG. 1A, the initial crack 13a is formed in a first step in a face of the semiconductor substrate 10 on a side on which the element region 11 is formed, and the fixing sheet 14 is affixed to a face on the opposite side. A sheet of a material which transmits the laser light 21 is used as the fixing sheet 14. When irradiation with the laser light 21 from the fixing sheet 14 side is concentrated on the interface 15 between the semiconductor substrate 10 and fixing sheet 14, a vicinity of a focal point 22 of the semiconductor substrate 10 is heated and vaporizes.

Figure 1B:
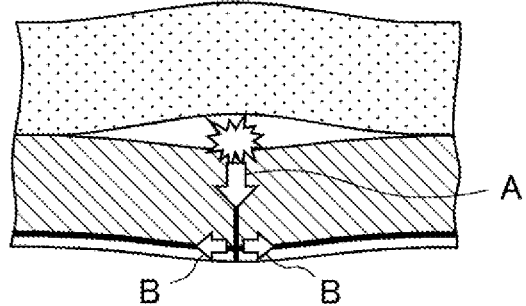
Figure 1C:
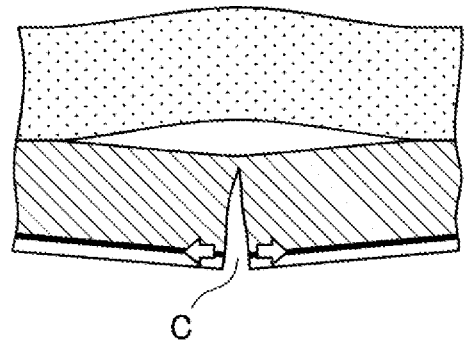

At this time, as shown in FIG. 1B, vaporizing pressure (an arrow A in the drawing) is generated, bending strain is generated in the semiconductor substrate 10, and tensile stress (arrows B in the drawing) is generated in a face on a side opposite to that of the focal point 22, that is, a face on the side on which the element region 11 is formed. As the tensile stress concentrates in a leading end of the crack, breakage of the semiconductor substrate 10 (indicated by C in the drawing) occurs in a form such as to extend the crack from the leading end of the initial crack 13a, as shown in FIG. 1C. The above is the basic processing principle.

For the sake of adhesiveness with the semiconductor substrate 10 and an expansion step in a later process, a resin film of vinyl chloride or the like is used as the fixing sheet 14 in the division process. The Young's modulus of a resin film of vinyl chloride or the like is in the region of two orders of magnitude lower than that of the semiconductor substrate 10, because of which the greater portion of the bending strain caused by vaporizing pressure is generated on the fixing sheet 14 side, and tensile stress acting on the semiconductor substrate 10 decreases, when such a resin film is used as the fixing sheet 14.

Figure 2A:
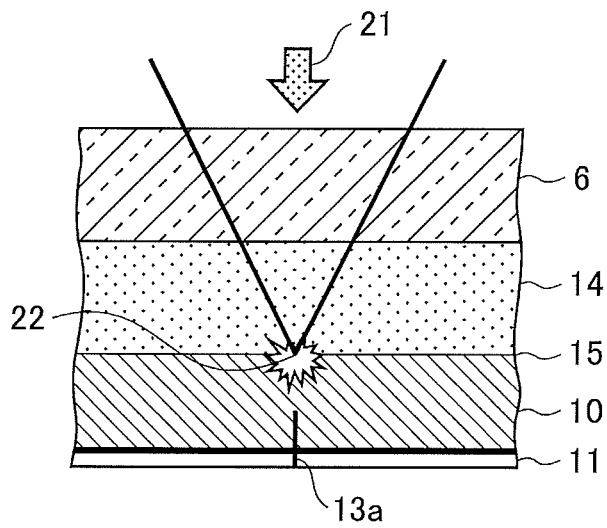
FIG. 2A to FIG. 2C are diagrams illustrating a principle of a process of extending an initial crack using the semiconductor element manufacturing method according to the first embodiment of the invention.
Figure 2B:
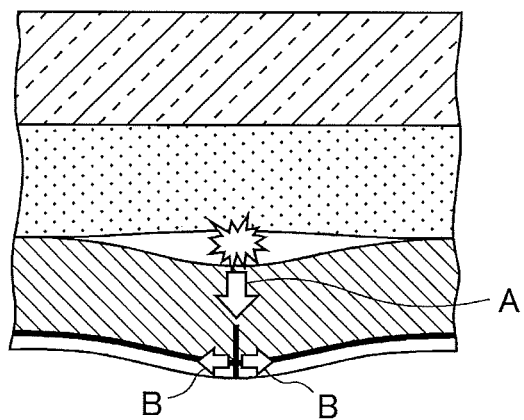
Figure 2C:
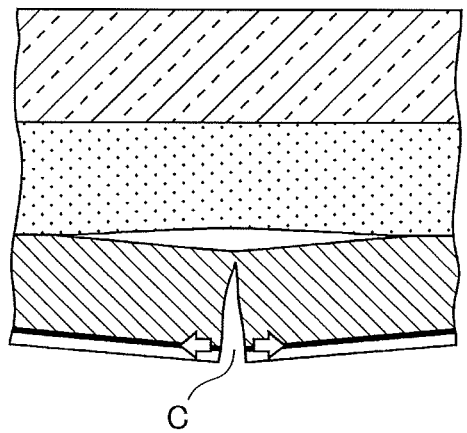

Therefore, as shown in FIG. 2A to FIG. 2C, a reinforcement member 6 is disposed across the fixing sheet 14 on the semiconductor substrate 10, whereby the bending strain of the fixing sheet 14 is restricted, the tensile stress acting on the semiconductor substrate 10 increases, and a crack extension effect is increased. As actions in FIG. 2A to FIG. 2C are the same as those in FIG. 1A to FIG. 1C, a description will be omitted.

Glass, polyethylene terephthalate (PET), or the same vinyl chloride or the like as the fixing sheet 14, which are materials which transmits the laser light 21, is used as the reinforcement member 6. When using the reinforcement member 6 that has a high Young's modulus like that of glass, there is an advantage in that an effect of restricting deformation of the fixing sheet 14 is large. When using the reinforcement member 6 that has a low Young's modulus like that of vinyl chloride, there is an advantage in that detachment is easy after the division process, and there is no need for a special chemical or device.

Next, using FIG. 3, the semiconductor element manufacturing device according to the first embodiment will be described. For the sake of the description, hidden line elimination is implemented only partially in FIG. 3. A semiconductor element manufacturing device 1 includes a light source 2, a mirror 3a, cylindrical lenses 4a and 4b, an objective lens 5, a support member 7 that supports the reinforcement member 6, and a moving stage 8.

The light source 2 of the laser light 21 is a YAG pulse laser. A 1,064 nm emission wavelength of the YAG laser is a wavelength longer than a 919 nm bandgap wavelength of the material of the semiconductor substrate 10, which is InP (indium phosphide) in the first embodiment, but by adopting a short pulse and high energy density, two-photon absorption is predominant, and a focal spot diameter can be reduced to $1/\sqrt{2}$ times compared with a case of one-photon absorption. Because of this, heat damage to the semiconductor substrate 10 and a region in which debris occurs can be localized.

The light source 2 can emit a single pulse light at a desired timing in accordance with a control signal from the exterior, and can also emit a continuous pulse light at a set frequency and pulse width. A sectional form of the laser light 21 emitted from the light source 2 is perfectly circular. When focal distances of the cylindrical lenses 4a and 4b, which are beam shaping means, are $f_{c1}$ and $f_{c2}$ respectively (defined as negative in a case of concave lenses; $|f_{c1}|>|f_{c2}|$), and a distance between lenses is $D_c=f_{c1}+f_{c2}$, $e=|f_{c1}|/|f_{c2}|$, the laser light 21 forms a parallel luminous flux of an elliptical cross-section such that an X direction diameter is 1/e times that in a Y direction.

Furthermore, irradiation with the laser light 21 is concentrated on the projected division line 12a of the interface between the semiconductor substrate 10 and fixing sheet 14 by the objective lens 5, which is beam irradiation means. A focal spot 23 of the laser light 21 is of an elliptical form such that an X direction diameter 23a is e times greater than a Y direction diameter 23b (hereafter, e is called an ellipse ratio). A case in which there are no cylindrical lenses 4a and 4b (ellipse ratio e=1) is also implemented in an experiment to be described hereafter (refer to FIG. 8).

The semiconductor substrate 10 is such that the fixing sheet 14 is affixed to the face on the side opposite the face on which the element region 11 is formed, and furthermore, the reinforcement member 6 is affixed across the fixing sheet 14. The material of the fixing sheet 14 is vinyl chloride, and the material of the reinforcement member 6 is white glass plate. These are both materials that allow a YAG laser (1,064 nm) to transmit.

The semiconductor substrate 10 affixed to the reinforcement member 6 across the fixing sheet 14 is further disposed on the moving stage 8 across the support member 7. The moving stage 8 doubles as irradiation position moving means, which moves a relative positional relationship between the semiconductor substrate 10 and the focal point 22 of the laser light 21, and rotation adjusting means, which changes a relative angle between an orientation of the semiconductor substrate 10 and a major axis direction of the ellipse of the focal spot form of the laser light 21, whereby an X axis, Y axis, and Z axis can be moved, and the Z axis can be rotated.

Using FIG. 4A to FIG. 4C, the semiconductor substrate manufacturing method according to the first embodiment will be described in detail. Firstly, as shown in FIG. 4A, the fixing sheet 14 is affixed to the face of the semiconductor substrate 10 on the side opposite the face on which the element region 11 is formed, and the initial crack 13a is formed in one end portion of the semiconductor substrate 10 on the projected division line 12a, which is an upper end portion of a projected division face 12 (first step). In the first embodiment, the initial crack 13a is formed by scribing with a point scriber 9. An arrow D in the drawing indicates a direction of movement of the point scriber 9.

Continuing, as shown in FIG. 4B, multiple points are irradiated by the focal point of the laser light 21 being moved on the projected division line 12a using the semiconductor element manufacturing device 1 according to the first embodiment (refer to FIG. 3), sequentially extending the initial crack 13a to the other end portion of the semiconductor substrate 10 (second step). In the first embodiment, the fixing sheet 14 transmits the laser light 21, and the interface between the fixing sheet 14 and semiconductor substrate 10 is irradiated with the laser light 21 from the fixing sheet 14 side.

At this time, absorption of the laser light 21 is concentrated on the interface between the semiconductor substrate 10 and fixing sheet 14, whereby a large vaporizing pressure is obtained, and an alteration and burning of the fixing sheet 14 can be avoided. Also, as the fixing sheet 14 is affixed to the face of the semiconductor substrate 10 on the side opposite to that of the element region 11, irradiation with the laser light 21 is carried out from the fixing sheet 14 side, whereby heat damage to the element region 11 and debris can be reduced.

In the second step, the focal spot form of the laser light 21, which has a pulse laser as the light source 2, becomes elliptical, and the major axis of the elliptical focal spot 23 is of a direction following the projected division line 12a, owing to the cylindrical lenses 4a and 4b, which are the beam shaping means. Furthermore, with a semi-major axis a of the ellipse satisfying Expression 1 below, irradiation with the laser light 21 is concentrated on the projected division line 12a of the interface 15 between the semiconductor substrate 10 and fixing sheet 14. An advantage of satisfying Expression 1 will be described hereafter.

(Math. 1)

Math. 1

$$a \geq 2\sqrt{\frac{kt_p}{c\rho}}$$ (Expression 1)

k: semiconductor substrate thermal conductivity (W/m·K)
c: semiconductor substrate specific heat capacity (J/kg·K)
ρ: semiconductor substrate density (kg/m³)
$t_p$: laser light pulse width (s)

As a specific operation, the direction of the projected division line 12a is caused to coincide with a cleavage propagating direction of the InP substrate, and the Z-axis rotation of the moving stage 8 is adjusted so that the projected division line 12a (cleavage propagating direction) coincides with the major-axis direction (X-axis direction) of the ellipse of the focal spot form. Also, X-axis, Y-axis, and Z-axis movements are adjusted so that the focal point is positioned in a vicinity of the leading end 13b of the initial crack 13a in the interface.

Furthermore, as shown in FIG. 4C, the moving stage 8 is moved a distance p in a −X direction, the focal point is positioned on a side of an undivided region in the vicinity of the leading end 13b of the crack 13, and irradiation with the pulse laser light 21 is carried out, thereby extending the crack 13. The distance p is called an irradiation pitch. An arrow E in the drawing indicates a direction of movement of the moving stage 8.

Subsequently, movement of the moving stage 8, irradiation with the laser light 21, and extension of the crack 13 are repeated in the same way, the crack 13 is extended to the end portion of the projected division line 12a on the side opposite to that of the initial crack 13a, and the semiconductor substrate 10 is divided. By the crack 13 being extended by irradiation with the laser light 21 being divided several times, energy per time of the laser light 21 can be reduced in comparison with when extending the crack 13 by the whole length of the projected division line 12a with one irradiation, and heat damage to the element region 11 and debris can be reduced.

FIG. 5A and FIG. 5B are schematic views that illustrate an effect of an increase in tensile stress caused by the elliptical focal spot using a simple model, wherein FIG. 5A shows a case of irradiating with a laser light whose focal spot form is perfectly circular, and FIG. 5B shows a case of irradiating with a laser light whose focal spot form is an ellipse with an ellipse ratio of e=2. In FIG. 5, how distortion and stress occur in a face in which bending strain due to vaporizing pressure is being generated is expressed with a model of mass points (black circles) and springs (solid lines) between the mass points.

An effect of the crack extension using the elliptical focal spot in the second step will be described using FIG. 5A and FIG. 5B. When irradiating with a laser light whose focal spot form is perfectly circular, $P_1$=1 unit of vaporizing pressure is applied to a mass point C by an irradiation with laser light with one unit of energy, a displacement $\delta_1$ occurs at the mass point C, and a tensile force $P_2$ is generated among mass points N, E, S, and W, as shown in FIG. 5A. As the tensile force of $P_2 \times 4$ among the mass points N, E, S, and W is counterbalanced by the vaporizing pressure $P_1$, the magnitude of $P_2$ is one-fourth of a unit. That is, the tensile force acting in the N-S direction is one-fourth of a unit.

Meanwhile, when irradiating with a laser light whose focal spot form is an ellipse with an ellipse ratio of e=2, $P_1'$=½ unit of vaporizing pressure is applied to each of mass points $C_1$ and $C_2$ by an irradiation with laser light with one unit of energy, a displacement $\delta_1'$ occurs at each of the mass points $C_1$ and $C_2$, and a tensile force $P_2'$ is generated among mass points $N_1$, $N_2$, E, $S_1$, $S_2$, and W, as shown in FIG. 5B.

As the tensile force of $P_2' \times 6$ among the mass points $N_1$, $N_2$, E, $S_1$, $S_2$, and W is counterbalanced by the vaporizing pressure $P_1'$, the magnitude of $P_2'$ is one-sixth of a unit. The tensile force acting in the N-S direction ($N_1S_1$ direction, $N_2S_2$ direction) is two-sixths of a unit. In particular, when there is a W-E direction crack in a vicinity, tensile stress acting in the N-S direction concentrates in a leading end of the crack.

Thinking in the same way, when irradiating with a laser light whose focal spot form is an ellipse with an ellipse ratio of e having a major axis in the W-E direction, the tensile force acting in the N-S direction owing to an irradiation with laser light with one unit of energy is e/(e+1) units. A still more complex analysis is necessary for an actual three-dimensional structure, but a qualitative tendency is that when the focal spot form is an ellipse, the effect of extending the crack 13 in the major axis direction of the ellipse can be increased.

Note that energy applied to the focal spot 23 diffuses owing to thermal diffusion. When a processing region in which a processing target vaporizes widens, there is hardly any ovalization of the processing region resulting from thermal diffusion even when the focal spot form is an ellipse, and the effect of crack extension is not increased. Because of this, in the first embodiment, setting is such that the semi-major axis a of the ellipse of the laser light 21 focal spot form satisfies Expression 1, and the semi-major axis a of the ellipse is equal to or greater than a thermal diffusion length of the semiconductor substrate 10.

Figure 6C:
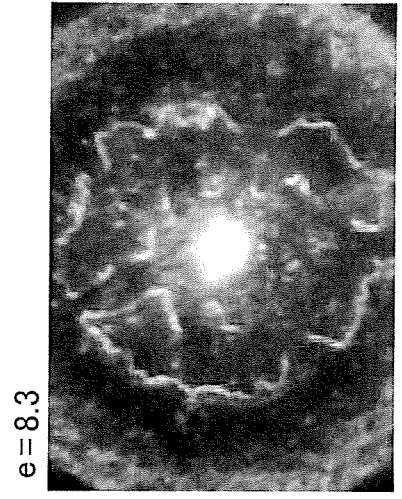
Figure 6F:
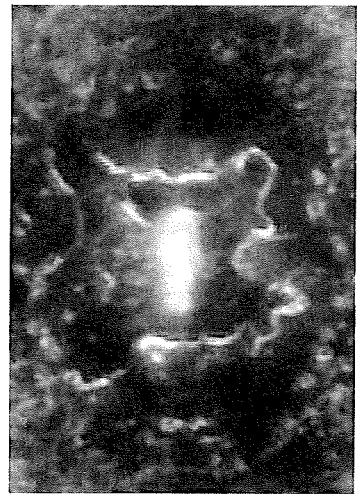
Figure 6B:
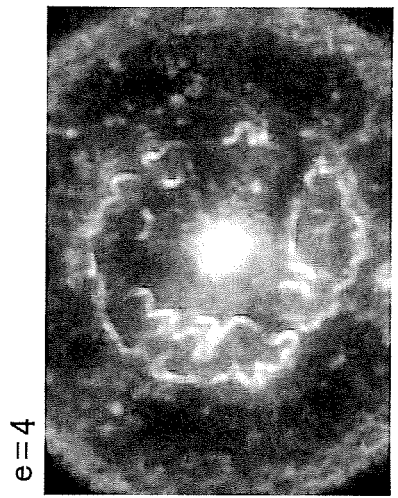
Figure 6E:
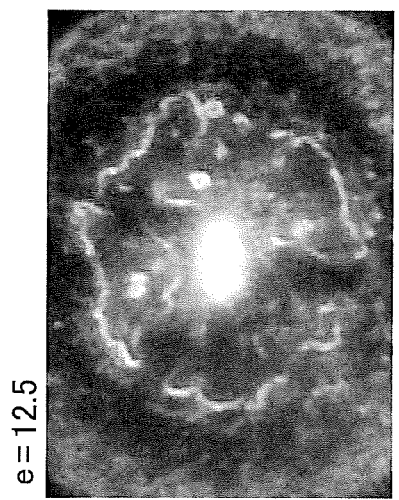
Figure 6D:
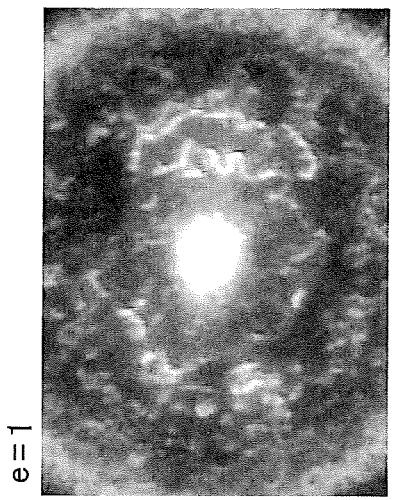

FIG. 6A to FIG. 6F are microscopic images showing processing traces caused by laser light when the ellipse ratio of a focal spot is changed, wherein FIG. 6A is when the ellipse ratio e=1, FIG. 6B is when the ellipse ratio e=4, FIG. 6C is when the ellipse ratio e=8.3, FIG. 6D is when the ellipse ratio e=12.5, FIG. 6E is when the ellipse ratio e=20, and FIG. 6F is when the ellipse ratio e=25. A wavelength of the laser light used for irradiation is 1,064 nm (two-photon absorption), a numerical aperture (NA) of an objective lens is 0.4, a pulse width $t_p$ is 160 ns, and a processing target is InP.

A diameter of a focal spot when the ellipse ratio e=1, with an Airy disk diameter in the case of two-photon absorption as $D_A$, is 2.3 μm, and the semi-major axis a of a focal spot in the case of an ellipse ratio e is $eD_A/2$. As the thermal conductivity k of InP is 70 W/K·m, the specific heat capacity c is 320 J/kg·K, and the density ρ is 4,787 kg/m³, the thermal diffusion length is $L_f = 2\sqrt{(kt_p/c\rho)} = 5.4$ μm.

When the ellipse ratio e is 1 to 4, the semi-major axis a of the focal spot is shorter than the thermal diffusion length $L_f$, and a form of the processing trace is practically a perfect circle. When the ellipse ratio e is 8.3, the semi-major axis a of the focal spot is equal to or greater than the thermal diffusion length $L_f$, and although the processing trace form is still practically a perfect circle when the ellipse ratio e is 8.3, the processing trace clearly becomes an ellipse when the ellipse ratio e is 12.5 or greater.

Figure 7:
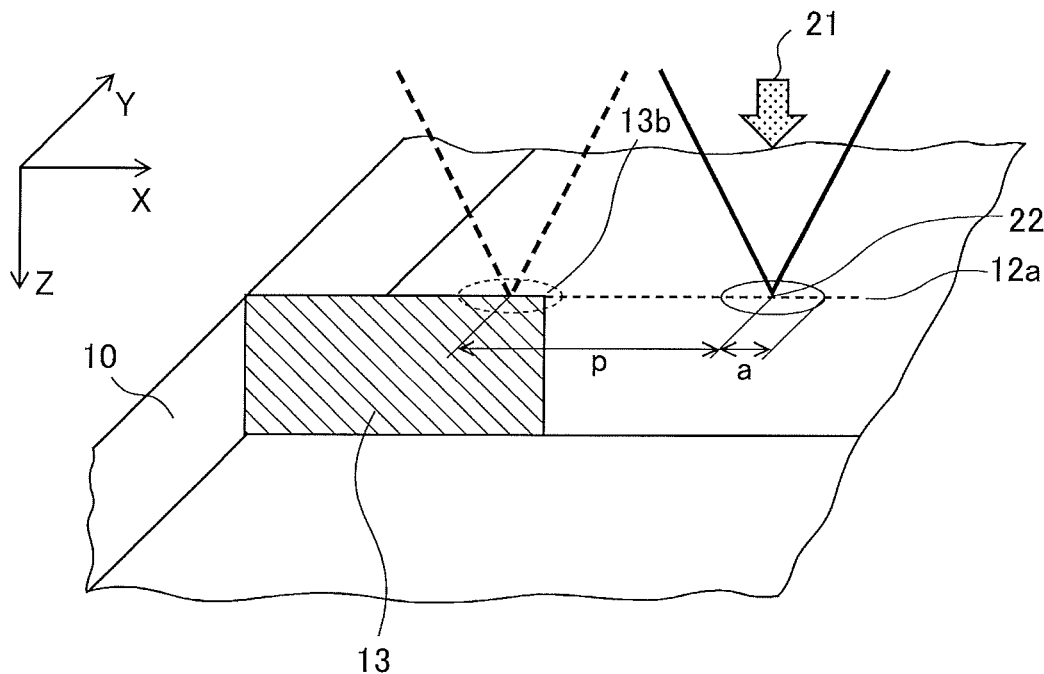
FIG. 7 is a diagram showing a method of experimentation on a crack extension effect with respect to ellipse ratio in the first embodiment of the invention.

Results of an experiment on crack extension effect with respect to ellipse ratio will be described using FIG. 7 and FIG. 8. In the experiment, as shown in FIG. 7, the semiconductor substrate 10 is moved the distance p in the −X direction, the focal point 22 is moved to the side of the undivided region in the vicinity of the leading end 13b of the crack 13, and irradiation with the pulse laser light 21 is carried out. Irradiation is carried out three times, and a maximum value of the irradiation pitch p of the laser light 21 when extension of the crack 13 can be confirmed all three times is taken to be a crack extension distance Lc.

Figure 8:
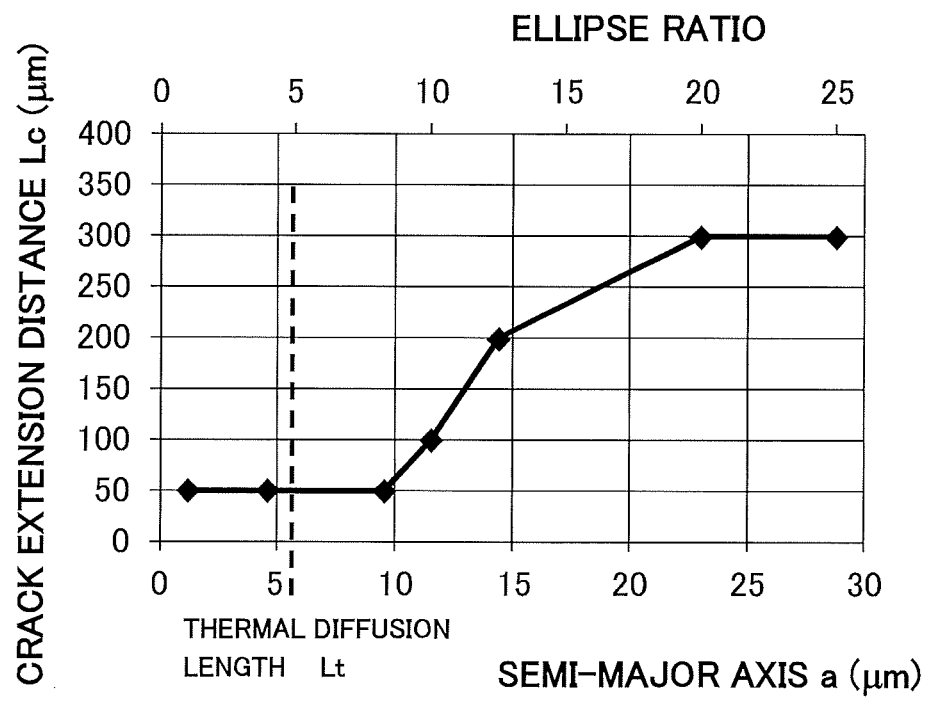
FIG. 8 is a diagram showing results of experimentation on a crack extension effect with respect to ellipse ratio in the first embodiment of the invention.

FIG. 8 is a graph showing results of the heretofore described experiment, wherein the horizontal axis shows the semi-major axis a (μm) with respect to each ellipse ratio, and the vertical axis shows the crack extension distance Lc (μm). As shown in FIG. 8, it is clear that an effect of the focal spot form being an ellipse is obtained by satisfying Expression 1, wherein the semi-major axis a is equal to or greater than the thermal diffusion length $L_t$ (5.4 μm).

In the first embodiment, the focal spot form of the laser light 21 is an ellipse, but provided that the focal spot form of the invention is such that the lengths of the axes in the vertical direction and horizontal direction differ, and Expression 1, wherein the semi-major axis a of the focal spot form is equal to or greater than the thermal diffusion length $L_t$ of the semiconductor substrate 10, is satisfied, the focal spot form may be, in addition to an ellipse, an oval, a rectangle, or the like.

Also, in the first embodiment, the cylindrical lenses 4a and 4b are proposed as the beam shaping means for adopting an ellipse as the form of the focal spot 23 but, the beam shaping means not being limited to this, astigmatism using a single cylindrical lens, or a publicly known optical system, such as an elliptical reticle, that can ovalize the form of the focal spot 23, may be used.

Also, in the first embodiment, the moving stage 8 is proposed as the irradiation position moving means that moves the relative positional relationship between the semiconductor substrate 10 and the focal point 22 of the laser light 21 but, the irradiation position moving means not being limited to this, a configuration wherein an objective lens is mounted on a moving stage, or a publicly known optical system, such as a Galvano scanner mirror, that moves the relative positional relationship of the focal point 22, may be used.

According to the semiconductor element manufacturing method and manufacturing device 1 according to the first embodiment, as heretofore described, an ellipse is adopted as the focal spot form of the laser light 21, and the initial crack 13a is extended by irradiation with the laser light 21 being concentrated on the projected division line 12a of the interface 15 between the semiconductor substrate 10 and fixing sheet 14, because of which the effect of extending the crack in the major axis direction of the ellipse is greater than in a case in which the focal spot form is a perfect circle, and the energy of the laser light 21 can be reduced. Because of this, heat damage to the element region 11 of the semiconductor substrate 10 and debris can be reduced, and a division face 12 with good flatness can be stably obtained.

Also, by the major axis of the ellipse of the focal spot form being in a direction following the projected division line 12a, and the semi-major axis a of the ellipse satisfying Expression 1, the semi-major axis a of the ellipse is equal to or greater than the thermal diffusion length $L_t$, and the effect of extending the crack in the major axis direction of the ellipse can be increased. Furthermore, by irradiating with the laser light 21 from the fixing sheet 14 side, heat damage to the element region 11 and debris can be reduced, and deterioration of element characteristics can be restricted. For the above reasons, the semiconductor element manufacturing method and manufacturing device 1 according to the first embodiment are applicable to a formation of a resonator mirror of a laser diode.

Second Embodiment

A second embodiment of the invention differs from the first embodiment in that the wavelength of the laser light 21 emitted from the semiconductor element manufacturing device 1 is a wavelength absorbed by the semiconductor substrate 10 (for example, 532 nm when the semiconductor substrate 10 is of InP). As other configurations are the same as in the first embodiment, a description will be omitted (refer to FIG. 3).

According to the second embodiment, in addition to the same advantages as in the first embodiment, the laser light 21 is efficiently absorbed in the interface 15 between the semiconductor substrate 10 and fixing sheet 14 by using the laser light 21 with a wavelength absorbed by the semiconductor substrate 10, because of which the vaporizing pressure and tensile stress can be further increased. Because of this, the energy of the laser light 21 needed for division can be reduced, and heat damage to the element region 11 of the semiconductor substrate 10 and debris can be reduced.

Third Embodiment

Figure 9:
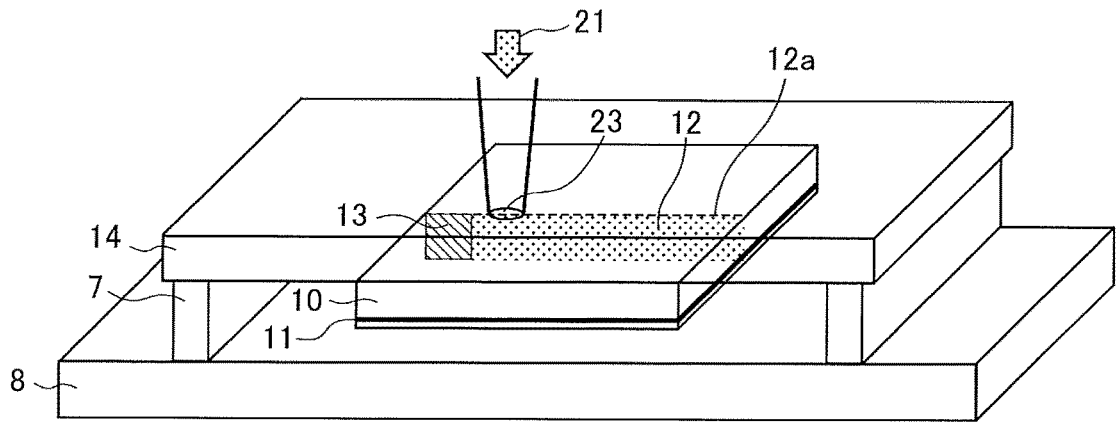
FIG. 9 is a perspective view showing one portion of a semiconductor element manufacturing device according to a third embodiment of the invention.

FIG. 9 is a perspective view showing one portion of a semiconductor element manufacturing device according to a third embodiment of the invention. The semiconductor element manufacturing device according to the third embodiment differs from the first embodiment in that no reinforcement member 6 is disposed. As other configurations are the same as in the first embodiment, a description will be omitted (refer to FIG. 3).

As shown in the experiment results described in the first embodiment (refer to FIG. 8), the sufficient crack extension distance Lc is obtained by satisfying Expression 1, wherein the semi-major axis a of the ellipse of the focal spot form of the laser light 21 is equal to or greater than the thermal diffusion length $L_t$. Also, by the reinforcement member 6 being disposed on the semiconductor substrate 10 across the fixing sheet 14, bending strain of the fixing sheet 14 is restricted, and the crack extension effect can be increased.

However, the crack extension distance Lc differs in accordance with conditions such as the material and thickness of the semiconductor substrate 10, the wavelength of the light source 2 of the laser light 21, pulse energy, and pulse width. Consequently, depending on the conditions, the semiconductor element design may be such that the sufficient crack extension distance Lc is obtained even without disposing the reinforcement member 6, in which case the reinforcement member 6 need not be used.

The fixing sheet 14 used for a semiconductor element manufacturing method according to the third embodiment is a sheet which transmits the laser light 21, in the same way as in the first embodiment, and an interface between the semiconductor substrate 10 and fixing sheet 14 is irradiated with the laser light 21 from the fixing sheet 14 side. According to the third embodiment, in addition to the same advantages as in the first embodiment, the dividing process can be simplified by not using the reinforcement member 6.

Fourth Embodiment

Figure 10:
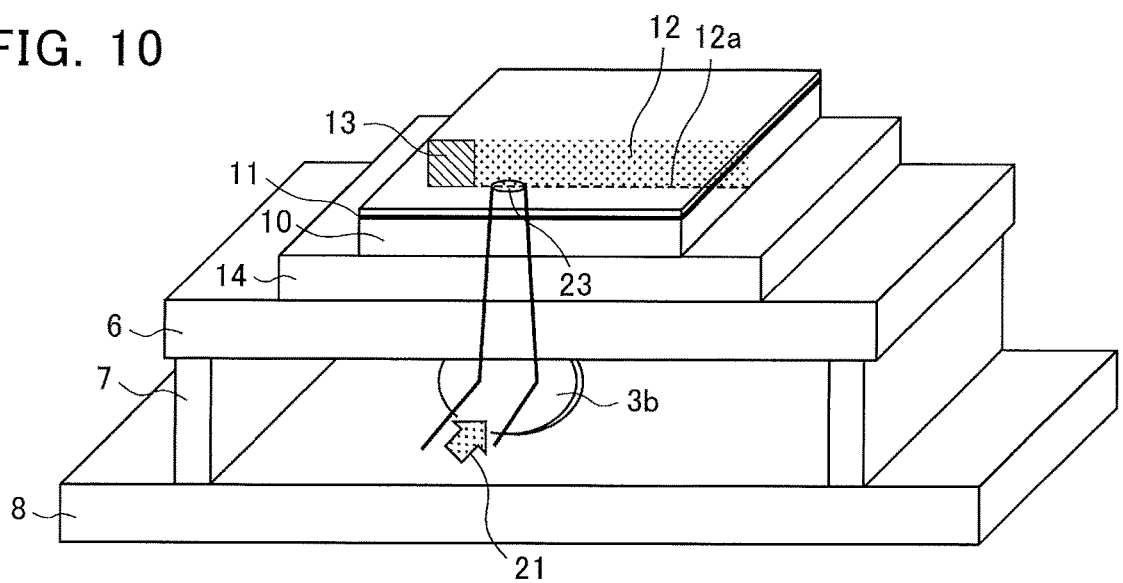
FIG. 10 is a perspective view showing one portion of a semiconductor element manufacturing device according to a fourth embodiment of the invention.

FIG. 10 is a perspective view showing one portion of a semiconductor element manufacturing device according to a fourth embodiment of the invention. The semiconductor element manufacturing device according to the fourth embodiment differs from the first embodiment in that irradiation with the laser light 21 is carried out from below the semiconductor substrate 10. As other configurations are the same as in the first embodiment, a description will be omitted (refer to FIG. 3).

In the fourth embodiment, as shown in FIG. 10, irradiation with the laser light 21 is carried out from below the semiconductor substrate 10, because of which the laser light 21 is guided from the front of the drawing, and reflected upward by a mirror 3b. Also, as irradiation with the laser light 21 is carried out from the fixing sheet 14 side toward an interface between the semiconductor substrate 10 and fixing sheet 14, a disposition order of the semiconductor substrate 10, fixing sheet 14, and reinforcement member 6 is the reverse of that in the first embodiment.

According to the fourth embodiment, in addition to the same advantages as in the first embodiment, the semiconductor substrate 10 is mounted on the fixing sheet 14, because of which there is no concern that the semiconductor substrate 10 will become detached from the fixing sheet 14 under the weight of the semiconductor substrate 10 itself and fall, and a stabilizing of the division process can be achieved.

Fifth Embodiment

Figure 11:
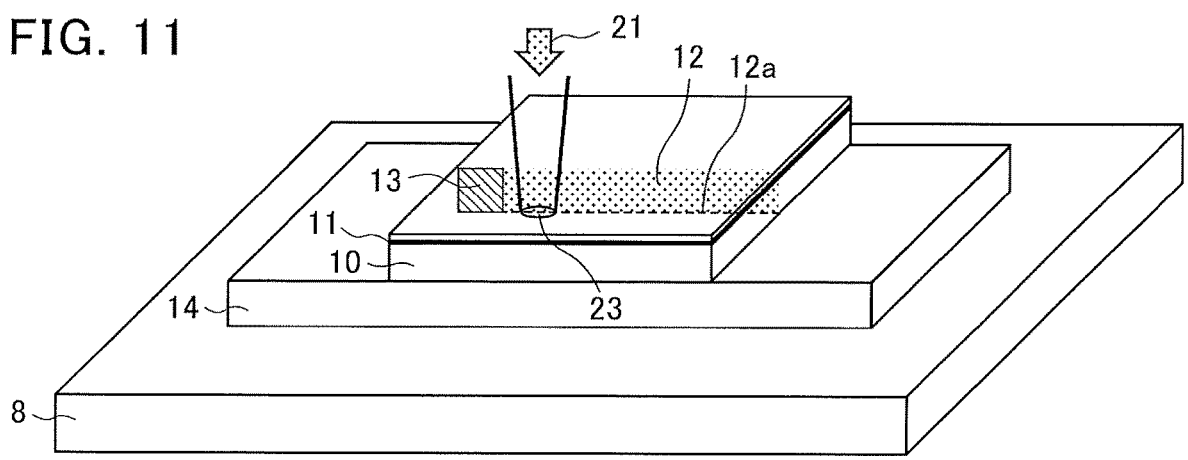
FIG. 11 is a perspective view showing one portion of a semiconductor element manufacturing device according to a fifth embodiment of the invention.

FIG. 11 is a perspective view showing one portion of a semiconductor element manufacturing device according to a fifth embodiment of the invention. The semiconductor element manufacturing device according to the fifth embodiment differs from the first embodiment in that irradiation with the laser light 21 is carried out from a side of the semiconductor substrate 10 toward an interface between the semiconductor substrate 10 and fixing sheet 14, and that no reinforcement member 6 is disposed. As other configurations are the same as in the first embodiment, a description will be omitted (refer to FIG. 3).

In the fifth embodiment too, in the same way as in the fourth embodiment, the semiconductor substrate 10 is mounted on the fixing sheet 14, because of which there is no concern that the semiconductor substrate 10 will become detached from the fixing sheet 14 under the weight of the semiconductor substrate 10 itself and fall, and a stabilizing of the division process can be achieved. Also, by the fixing sheet 14 being mounted on an upper face of the moving stage 8, the moving stage 8 also performs a role as the reinforcement member 6, because of which the reinforcement member 6 does not need to be disposed.

Also, as the laser light 21 is caused to be absorbed only in a vicinity of the interface between the semiconductor substrate 10 and fixing sheet 14, the wavelength of the laser light 21 is set to be a wavelength longer than the bandgap wavelength of the semiconductor substrate 10 in order that multi-photon absorption is dominant, in addition to which the pulse width of the laser light 21 is set to be short, and energy density at the focal point is set to be high.

According to the fifth embodiment, in addition to the same advantages as in the first embodiment, absorption of the laser light 21 can be concentrated in the vicinity of the focal point, and a high vaporizing pressure is obtained. Furthermore, the focal spot diameter can be reduced in comparison with the case of one-photon absorption, and a region in which heat damage or debris due to processing occurs can be localized. Also, in the same way as in the fourth embodiment, the semiconductor substrate 10 is mounted on the fixing sheet 14, because of which there is no concern that the semiconductor substrate 10 will become detached from the fixing sheet 14 under the weight of the semiconductor substrate 10 itself and fall, and a stabilizing of the division process can be achieved.

Sixth Embodiment

Figure 12:
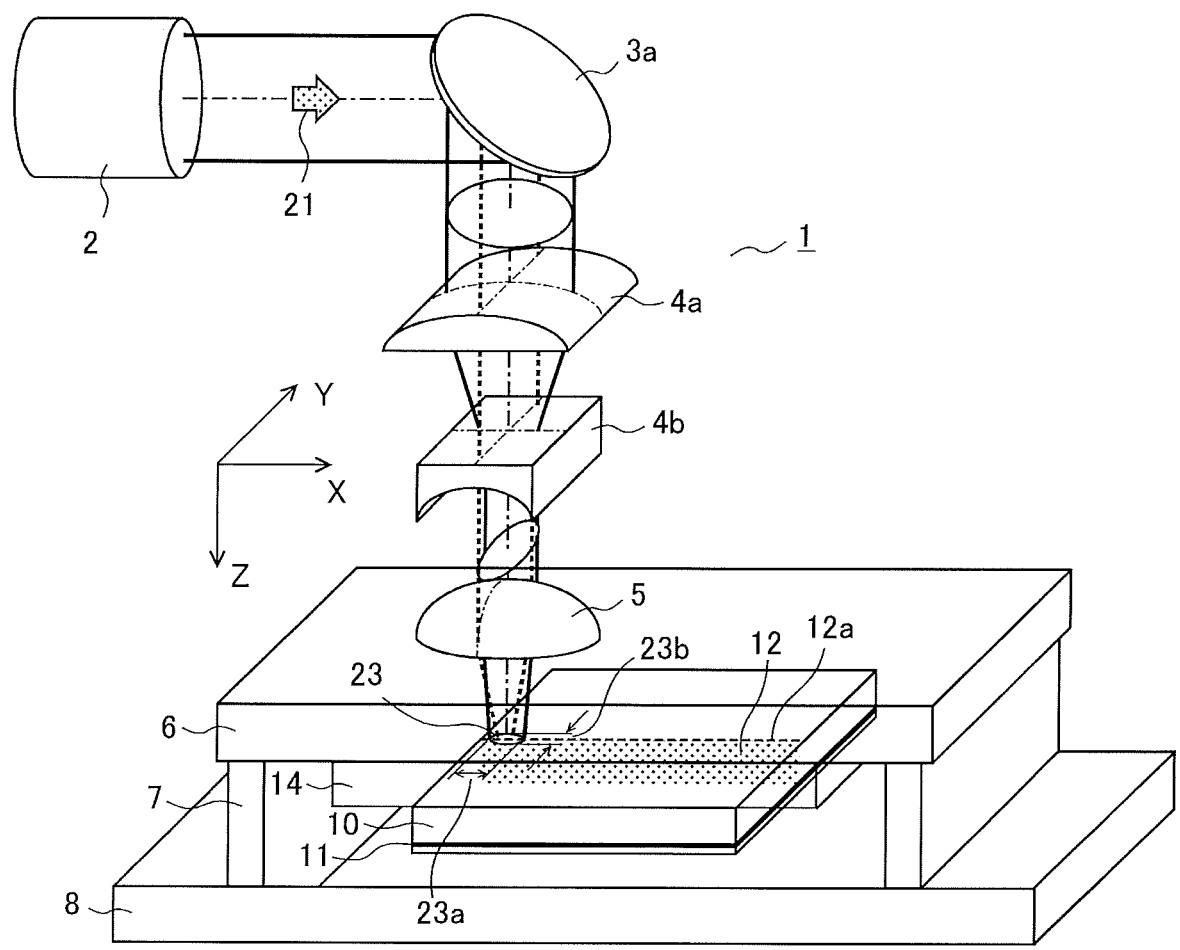
FIG. 12 is a perspective view illustrating a semiconductor element manufacturing method according to a sixth embodiment of the invention.

FIG. 12 is a perspective view showing a semiconductor element manufacturing method according to a sixth embodiment of the invention. In the sixth embodiment, the first step of forming the initial crack 13a in the semiconductor substrate 10 is implemented using the semiconductor element manufacturing device 1, as shown in FIG. 12. As the semiconductor element manufacturing device 1 shown in FIG. 12 is the same as the semiconductor element manufacturing device 1 described in the first embodiment (refer to FIG. 3), a description of each portion will be omitted.

The first step of the semiconductor element manufacturing method according to the sixth embodiment will be described. The focal spot form of the laser light 21, which has a pulse laser as the light source 2, is an ellipse, the major axis of the ellipse is in a direction following the projected division line 12a, and the semi-major axis a of the ellipse satisfies Expression 1. By irradiation with the laser light 21 being concentrated on the projected division line 12a of an interface between the semiconductor substrate 10 and fixing sheet 14, vaporizing pressure is generated in the interface, thereby forming the initial crack 13a.

The principle of the process of forming the initial crack 13a in the semiconductor substrate 10 using irradiation with the laser light 21 is as described in the first embodiment (refer to FIG. 1A to FIG. 1C and FIG. 2 A to FIG. 2C). Vaporizing pressure is generated in the interface 15 between the semiconductor substrate 10 and fixing sheet 14 by irradiation with the laser light 21, and tensile stress is generated in the face of the semiconductor substrate 10 on the side opposite the interface 15. Provided that the tensile stress is of a sufficient magnitude, a crack occurs in the semiconductor substrate 10, even without the initial crack 13a being formed in advance.

In the sixth embodiment, the first step of forming the initial crack 13a in the semiconductor substrate 10 is implemented in the semiconductor element manufacturing device 1, but it goes without saying that the subsequent second step can, of course, be implemented without interruption in the same semiconductor element manufacturing device 1.

According to the sixth embodiment, the first step of forming the initial crack 13a in the semiconductor substrate 10, and the second step of extending the initial crack 13a, thereby dividing the semiconductor substrate 10, can be implemented in the one semiconductor element manufacturing device 1. Consequently, the division process can be considerably simplified in comparison with the existing method implemented using the point scriber 9 and a three-point bending breaking device. The embodiments can be freely combined, and each embodiment can be modified or abbreviated as appropriate, without departing from the scope of the invention.

The invention claimed is:

1. A semiconductor element manufacturing method, comprising:
    a first step of affixing a vaporizing pressure confining sheet to a semiconductor substrate on which a plurality of elements are formed and forming an initial crack in one portion of a projected division line among the elements; and a second step of extending the initial crack by irradiating the projected division line of the semiconductor substrate with a laser light, thereby dividing the semiconductor substrate into the individual elements, wherein in the second step, a focal spot form of the laser light is an ellipse, a major axis of the ellipse is in a direction following the projected division line, irradiation with the laser light is concentrated on the projected division line of an interface between the semiconductor substrate and the vaporizing pressure confining sheet, and vaporizing pressure generated by the irradiation is confined between the semiconductor substrate and the vaporizing pressure confining sheet, and caused to act as a bending force on the semiconductor substrate.

2. The semiconductor element manufacturing method according to claim 1, wherein the initial crack is formed in one end portion of the semiconductor substrate on the projected division line in the first step, and in the second step, a plurality of points are irradiated by a focal point of the laser light being moved on the projected division line, sequentially extending the initial crack to another end portion of the semiconductor substrate.

3. The semiconductor element manufacturing method according to claim 1, wherein in the second step, a semi-major axis a of the ellipse of the focal spot form of the laser light satisfies an Expression 1 below:

$$a \geq 2\sqrt{\frac{kt_p}{c\rho}} \qquad \text{(Expression 1)}$$

k: semiconductor substrate thermal conductivity (W/m·K)
c: semiconductor substrate specific heat capacity (J/kg·K)
ρ: semiconductor substrate density (kg/m³)
$t_p$: laser light pulse width (s).

4. The semiconductor element manufacturing method according to claim 3, wherein in the first step, the focal spot form of the laser light is an ellipse, the major axis of the ellipse is in a direction following the projected division line, and the semi-major axis a of the ellipse satisfies the Expression 1, and the initial crack is formed by irradiation with the laser light being concentrated on the projected division line of the interface.

5. The semiconductor element manufacturing method according to claim 1, wherein the laser light has a pulse laser as a light source.

6. The semiconductor element manufacturing method according to claim 1, wherein the major axis of the ellipse of the laser light focal spot form is caused to coincide with a cleavage propagating direction of the semiconductor substrate.

7. The semiconductor element manufacturing method according to claim 1, wherein the vaporizing pressure confining sheet is affixed to a face of the semiconductor substrate on a side opposite to a face on which the element is formed.

8. The semiconductor element manufacturing method according to claim 1, wherein a reinforcement member is affixed to the semiconductor substrate across the vaporizing pressure confining sheet.

9. The semiconductor element manufacturing method according to claim 1, wherein the vaporizing pressure confining sheet is a sheet which transmits the laser light, and the interface is irradiated with the laser light from a side of the vaporizing pressure confining sheet.

10. The semiconductor element manufacturing method according to claim 9, wherein a wavelength of the laser light is a wavelength absorbed by the semi conductor substrate.

11. The semiconductor element manufacturing method according to claim 1, wherein the semiconductor substrate is a substrate which transmits the laser light, and the interface is irradiated with the laser light from a side of the semiconductor substrate.

12. A semiconductor element manufacturing device, comprising:
a beam shaping device that shapes a focal spot form of a laser light emitted from a light source into an ellipse, and sets a major axis of the ellipse to a direction following a projected division line of a semiconductor substrate;
a beam irradiation device that concentrates irradiation with the laser light emitted from the light source on the projected division line of an interface between a vaporizing pressure confining sheet affixed to the semiconductor substrate and the semiconductor substrate, and irradiates from a side of the vaporizing pressure confining sheet; and
a support member that supports the vaporizing pressure confining sheet or a reinforcement member affixed to the vaporizing pressure confining sheet on a moving stage, wherein
the semiconductor substrate is disposed on the moving stage across the support member.

13. The semiconductor element manufacturing device according to claim 12, comprising an irradiation position moving device that moves a relative positional relationship between the semiconductor substrate and the focal point of the laser light.

14. The semiconductor element manufacturing device according to claim 12, comprising a rotation adjusting device that changes a relative angle between an orientation of the semiconductor substrate and the major axis direction of the ellipse of the focal spot form of the laser light.

* * * * *